(12) United States Patent
Stephani (10) Patent No.: US 7,603,513 B2
(45) Date of Patent: Oct. 13, 2009

(54) ROM-BASED MULTIPLE MATCH CIRCUIT

(75) Inventor: Richard Stephani, Saint Paul, MN (US)

(73) Assignee: LSI Corporation, Milpitas, CA (US)

( * ) Notice: Subject to any disclaimer, the term of this patent is extended or adjusted under 35 U.S.C. 154(b) by 350 days.

(21) Appl. No.: 11/538,555

(22) Filed: Oct. 4, 2006

(65) Prior Publication Data

US 2008/0086592 A1    Apr. 10, 2008

(51) Int. Cl.
*G06F 12/00* (2006.01)
(52) U.S. Cl. .................... 711/108; 711/102; 365/104
(58) Field of Classification Search ............. 711/108, 711/102; 365/104
See application file for complete search history.

(56) References Cited

U.S. PATENT DOCUMENTS

| 7,043,601 | B2 * | 5/2006 | McKenzie et al. | 711/108 |
| 2002/0145178 | A1 * | 10/2002 | Tsao et al. | 257/620 |
| 2002/0161969 | A1 * | 10/2002 | Nataraj et al. | 711/108 |
| 2003/0145178 | A1 * | 7/2003 | Jiang et al. | 711/158 |

\* cited by examiner

*Primary Examiner*—Christian P Chace
*Assistant Examiner*—Hashem Farrokh
(74) *Attorney, Agent, or Firm*—William W. Cochran; Cochran Freund & Young LLC (57) ABSTRACT

A ROM-based multiple match system and method for producing a match signal in an addressable memory system are described. In various embodiments of the present invention, a ROM is used to generate single match and multiple match signals, as well as encoded address signals indicating a matching location(s) within the memory. The ROM is provided with specific entries in the form of a lookup table, which are used to signal combinational logic that provides an output to the system. In certain embodiments of the invention, the ROM may be divided into hierarchical sub-blocks that provide more efficient processing of a digital data related to matching of an input word, improved usage of space within a chip or better scalability across the multiple match system.

18 Claims, 7 Drawing Sheets

ROM-BASED MULTIPLE MATCH CIRCUIT

BACKGROUND

A. Technical Field

The present invention relates generally to multiple match circuits, and more particularly, to multiple match circuits in content addressable memory devices.

B. Background of the Invention

Current trends in memory devices are resulting in larger, faster, and better performing memory products. Certain special purpose memory devices, such as content addressable memory ("CAM") devices have been and are being developed to address these memory requirements.

A CAM device may operate as a cache memory and retrieve stored data by comparing an input word to pre-stored word entries so that one or more "matches" may be identified within the memory device. Based on the result of this comparison, an output on the CAM device provides an address(es) or memory location(s) associated with the matching word entry or entries. Various CAM devices provide an output on which a match signal is generated, which indicates that at least one word entry in the CAM matched the input word.

In some applications, the address of the pre-stored word entry having the highest priority is required. For example, in a CAM with 256-entries, address 0 through address 255, the address 0 may be assigned the highest priority. During a compare operation, if both addresses 144 and 11 match the word entry, the higher priority address or "priority-encoded address" would be the location with the higher priority.

In certain other applications, the priority-encoded address may not be required. As a result, a word entry may have multiple matches which may generate different outputs depending on the particular implementation of the CAM device. In one example, a "don't care" bit is generated that represents the priority-encoded address output. During such an occurrence, a signal emphasizing the fact that two or more matching data entries in the memory need to be asserted. This signal is known within the art as a "multiple match" signal.

Figure 1:
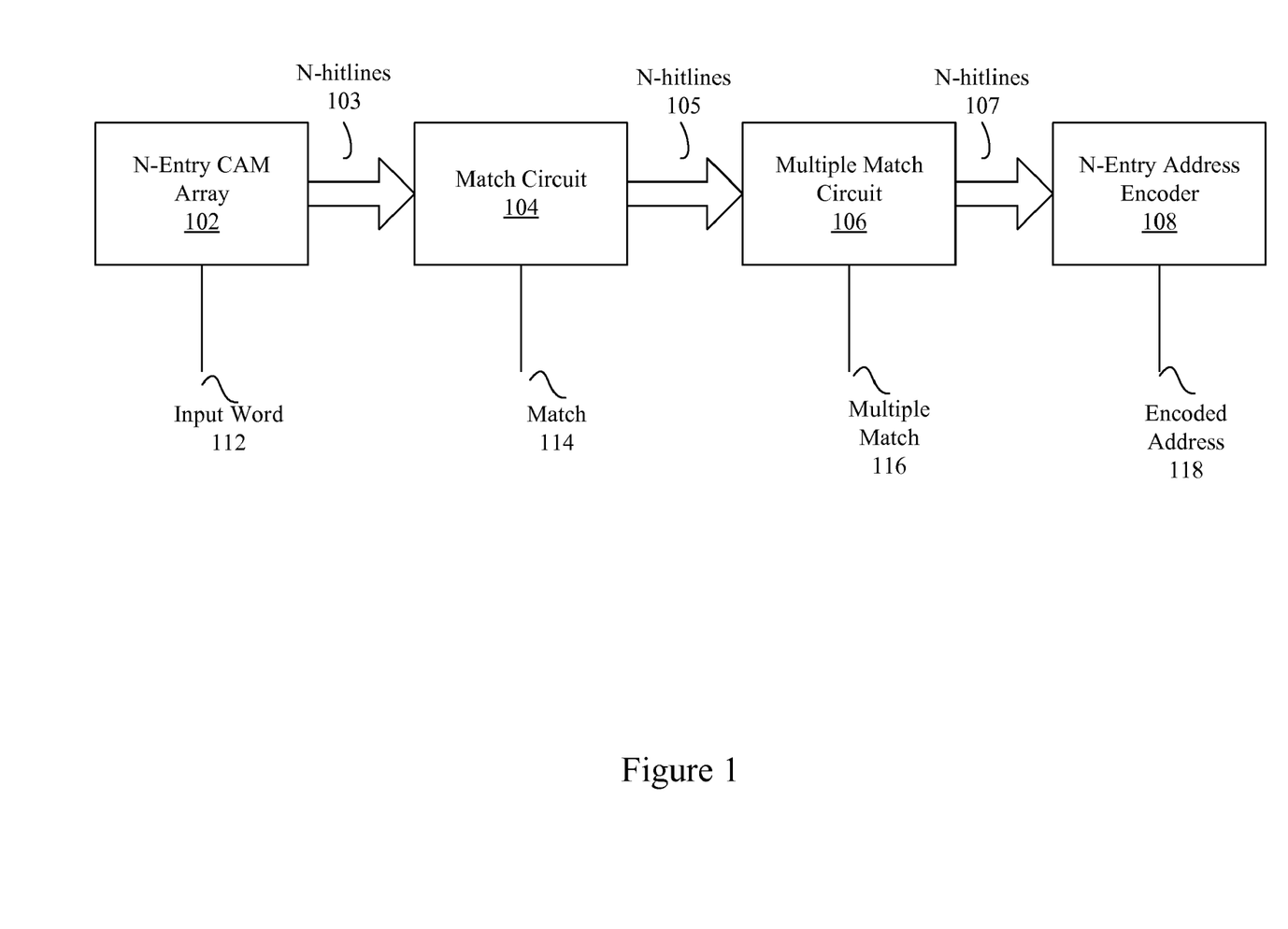

An exemplary CAM block diagram is shown in FIG. 1 which illustrates an n-entry CAM array 102 that stores word entries. An input word 112, which needs to be compared with the pre-stored word entries, is provided to the n-entry CAM array 102. A plurality of hitlines 103 are provided, each corresponding to a word entry within the CAM array 102, which may be asserted if the input word 112 matches a particular stored word entry. The hitlines 103 interface with a match circuit 104, which provides information on matching of any pre-stored word entry. Typically, no information regarding the matching of 2 or more entries is obtained from the output match 114 signal of the match circuit 104.

The hitlines 105 may further be connected to a multiple match circuit 106. If two or more of the word entries in the CAM are found to match the input word 112, a multiple match 116 signal is asserted by the multiple match circuit 106. Hitlines 107 may further connect to an n-entry address encoder 108. A priority-encoded address may be calculated and output through the encoded address 118 signal. One skilled in the art will recognize that an analysis of the match signal 114, the multiple match signal 116 and the encoded address signal 118 is required to obtain a complete understanding of the total number of matches and a corresponding address(es) of the match.

Figure 2:
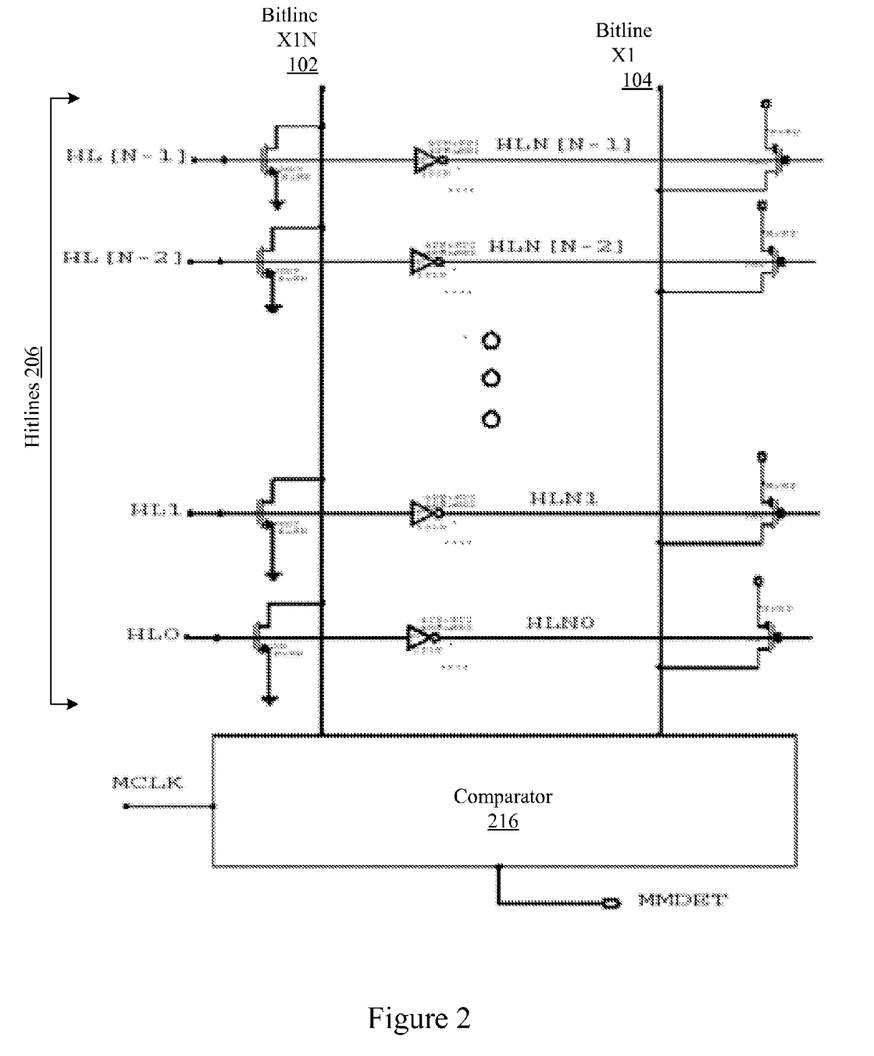
FIG. 2 illustrates an exemplary analog multiple match comparator circuit, which may be implemented within a CAM system.

A multiple match signal indicating the presence of two or more matches may be generated by using an analog comparator in a multiple-match detect circuit as shown in FIG. 2. A CAM memory having "n" number of pre-stored word entries may provide inputs to the multiple-match detect circuit in form of hit-lines 206. Two dedicated separate bitlines X1 202 and X1N 204 may be used for comparison in a comparator circuit 218. In particular, the bitline X1 202 may connect to n pull-up transistors and the bitline X2 204 may connect to n pull-down transistors.

Upon the occurrence of a single match, one of the pull down and one of the pull-up transistor are activated. The comparator circuit 218 compares the pull-up and the pull-down strength as per the current in the bitlines X1 202 and X1N 204. If there are two or more hits in the CAM memory, then two of the pull-up transistors and corresponding two pull-down transistors are turned on. The comparator may thus compare the pull-up strength and the pull-down strength in case of a single hit and multiple hit to distinguish between the two occurrences.

The use of an analog multiple match circuit may not yield accurate result when used with shrinking semiconductor technology applications, such as those applications using 90-nanometer and beyond manufacturing technologies. Device mismatch and leakage current increase as the fabrication constraints become increasingly more stringent. These mismatches and leakage currents make the comparison using the pull-down strength and the pull-up strength more error prone, which results in more inaccuracy in the multiple-match signal.

A digital circuit, comprising static AND/OR logic gates, may be used to implement a multiple match device. Generally, such a circuit may be implemented as an n-bit wide hierarchical AND/OR logic tree. A "Hit" and a "Multiple Hit" signal may be generated for every pair of words. A "Hit" means there is at least one match among the two words, and a signal on a corresponding hitline may be asserted. If multiple words in the CAM are found matching, then a Multiple Hit signal is asserted.

In one example, hitlines HL0 and HL1 are provided and correspond to signals from word 0 and word 1. A single hitline "H2" and multiple hit line "M2" are defined as follows:

H2=HL0 OR HL1
M2=HL0 AND HL1

The "hitline" signal H2 and the "multiple-hit" signal M2 may be used to generate a hit signal "H4" and a multiple hit signal M4 corresponding to a second level in a signaling hierarchy. This may be implemented using the hit and multiple hit signals H2T/M2T corresponding to the top pair of words and H2B/M2B corresponding to the bottom pair of words. As a result, H4 and M4 may be defined as:

H4=H2T OR H2B
M4=(H2T AND H2B) OR (M2T OR M2B)

These defined signals may be used in a hierarchical nature to produce a multiple match signal corresponding to numerous stored CAM word entries. Although the static gate implementation provides a robust method for implementing the multiple match function, the implementation may not be effectively used in high-speed applications above 800 MHz because of the number and speed of digital operations required in the identification of multiple matching instances.

SUMMARY OF THE INVENTION

A ROM-based multiple match system and method for producing a match signal in an addressable memory system are described. In various embodiments of the present invention, a ROM is used to generate single match and multiple match signals, as well as encoded address signals indicating a matching location(s) within the memory. The ROM is provided with specific entries in the form of a lookup table, which are used to signal combinational logic that provides an output to the system. In certain embodiments of the invention, the ROM may be divided into hierarchical sub-blocks that provide more efficient processing of a digital data related to matching of an input word, improved usage of space within a chip or better scalability across the multiple match system.

In certain embodiments of the present invention, a combinational logic circuit may be used to input the signals from the bitlines of the ROM lookup table to produce various signals indicating the presence of matches in the memory. The ROM may be created by defining a plurality of complimentary columns, coupled to the hitlines, which are used to identify multiple match scenarios. Outputs from the complimentary columns are provided to the combination logic.

The combinational logic may use various logic gates such as AND, OR, NAND or NOR gates to implement the functionality of the combinational logic. Alternatively, wide dynamic gates may also be used to affect the functionality of the combinational logic. The combinational logic provides a plurality of output signal describing both matching results and location addresses associated with a match or matches.

According to various embodiments of the invention, a hierarchical multiple matching system is provided in which multiple ROM sub-blocks process hitline data prior to a primary ROM. Hierarchical ROM processing of this digital data may provide a more efficient and scalable solution when large addressable memory devices are being used.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

Figure ("FIG.") 1 illustrates an exemplary block diagram of a CAM system currently used in the art.

DETAILED DESCRIPTION OF THE PREFERRED EMBODIMENTS

A ROM-based multiple match system and method for producing a match signal in an addressable memory system are described. In various embodiments of the present invention, a ROM is used to generate single match and multiple match signals, as well as encoded address signals indicating a matching location(s) within the memory. The ROM is provided with specific entries in the form of a lookup table, which are used to signal combinational logic that provides an output to the system. In certain embodiments of the invention, the ROM may be divided into hierarchical sub-blocks that provide more efficient processing of a digital data related to matching of an input word, improved usage of space within a chip or better scalability across the multiple match system.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into various types of memory systems including CAM devices. Structures and devices shown below in block diagram are illustrative of exemplary embodiments of the invention and are meant to avoid obscuring the invention. Furthermore, connections between components within the figures are not intended to be limited to direct connections. Rather, signals between these components may be modified or otherwise changed by intermediary components.

Reference in the specification to "one embodiment" or "an embodiment" means that a particular feature, characteristic, or function described in connection with the embodiment is included in at least one embodiment of the invention. The appearances of the phrase "in one embodiment" in various places in the specification are not necessarily all referring to the same embodiment.

A. Overview

Figure 3:
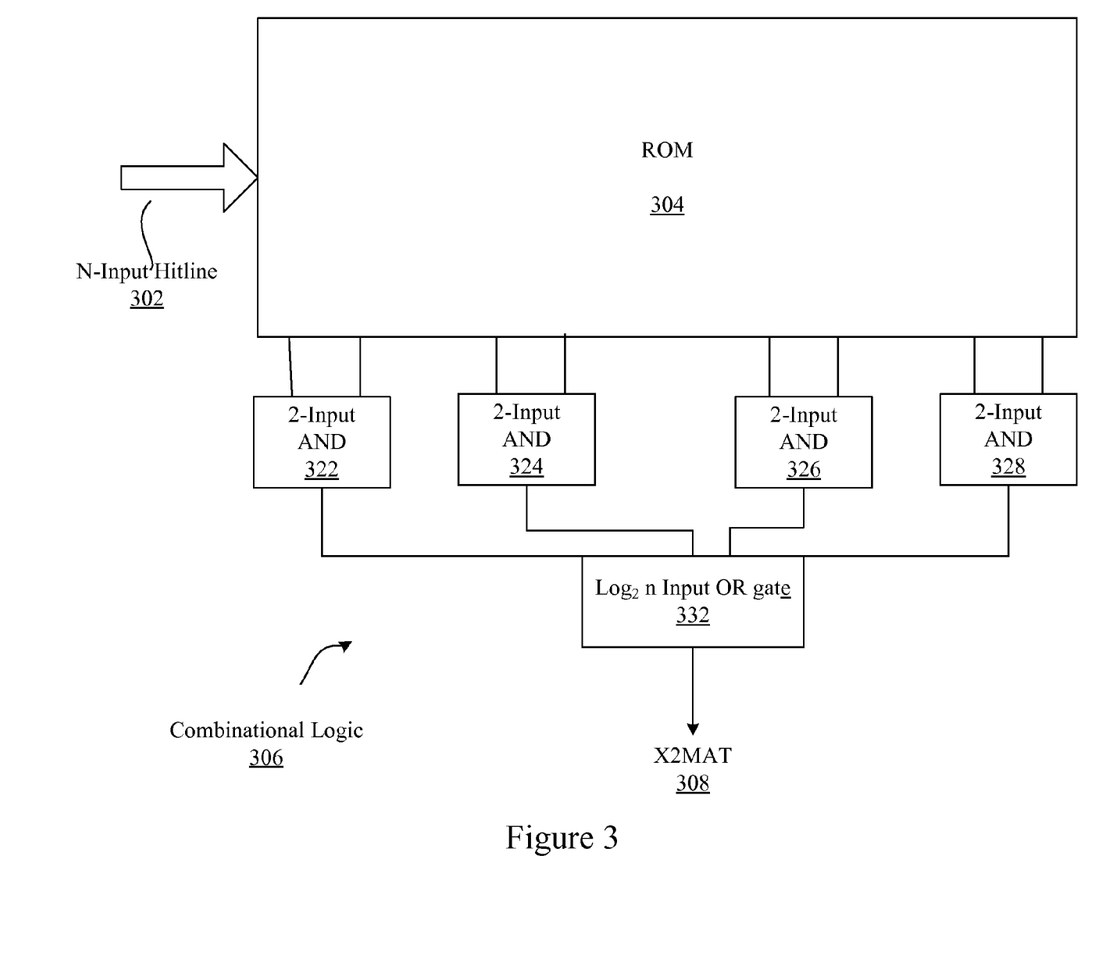
FIG. 3 shows a logical block diagram of a multiple match circuit according to various embodiments of the invention.

FIG. 3 illustrates a ROM-based multiple match system according to various embodiments of the invention. This system may be applied to a CAM device and efficiently identify matches, both single and multiple, between input words and stored data within the memory. A ROM 304 is provided that receives N input hitlines 302 on which digital data related to the matching of input words and stored words within the memory are received. The number of hitlines may depend on the capacity of the memory such that the number of hitlines correlates to a number of word entries pre-stored in the CAM.

The ROM 304 may connect to combinational logic 306 for processing the results of a match analysis associated with an input word. In various embodiments of the invention, logical gates are provided that receive signals from the ROM 304 which are based on a comparison of an input word on hitlines 302 to the contents within a memory. A multiple match signal 308 emphasizing the occurrence of multiple matches in the addressable memory is produced and provided to the system.

One skilled in the art will recognize that numerous different logic designs may be employed to process data from the ROM 304. In some embodiments of the invention, an array of 2-input AND gates 322, 324, 326, 328 interface with complimentary columns within the ROM 304 and are used in the combinational logic 306. The signal from each 2-input AND gates 322, 324, 326, 328 is fed into an OR gate 332 to produce a multiple match signal X2MAT 308.

The number of signals being provided to the combinational logic 306 depends on the number of hitlines 302 that are input into the ROM 304. The number of input lines to the OR gate 332 also depends on the number of hitlines 302. For example, in an addressable memory having N entries and corresponding addresses 0 through (N−1), the number of signals being fed into the combinational logic 306 would be equal to $(2 \times \log_2 N)$ and the number of 2-input AND gates utilized in the combinational logic 306 would be $(\log_2 N)$. Accordingly, the OR gate 332 used to produce the multiple match signal would have $(\log_2 N)$ number of input signals.

The structure of various embodiments of the ROM 304 and the operation of this particular combination logic implementation 306 are described in more detail below.

B. Structure of ROM

Figure 4:
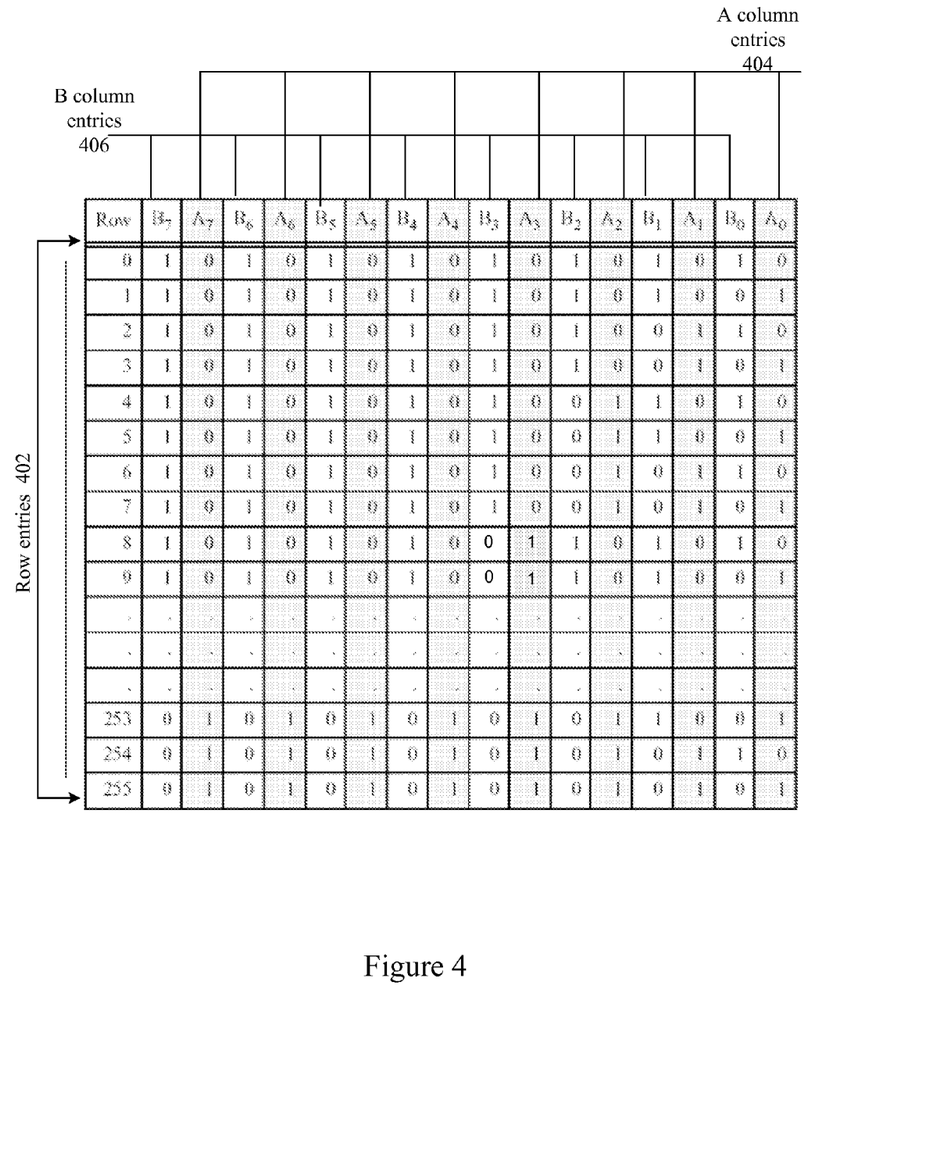
FIG. 4 is an exemplary ROM lookup table according to various embodiments of the invention.

FIG. 4 illustrates an exemplary ROM table that may be employed within a multiple match system according to various embodiments of the invention. The ROM table may be programmed to have various entries based on the size of an addressable memory. For example, a ROM table for a CAM device having 256 entries may comprise 256 rows of values within the table. The row entries 402 correspond to the size of an input word or number of hitlines to the input of the ROM.

The ROM is designed to contain columns that have functional relationships between each other. In this particular example, the total number of columns relates to the number of rows and is equal to $2 \times \log_2 N$, where N is the total number of rows. The columns of the lookup table are divided into pairs, with each pair being related to a particular word bit or hitline. FIG. 4 shows these column pairs as "A entries" and "B entries," in which the lookup table contains $\log_2 N$ number of "A entries" columns and $\log_2 N$ number of "B entries" columns. In one implementation of the table, the table contains 256 rows and 16 columns as shown in FIG. 4. The columns may be divided into eight "A entry" columns 404 corresponding to column numbers A0 to A7 and eight "B entry" columns 406 corresponding to columns numbers B0 to B7.

Each A entry column is designed to have a complementing B entry column, which contains inverse bits in relation to the A entry column. For example, column B0 420 is programmed to contain bits inverse to the entries in A0 column. This relationship between the column pairs allows for identification of both single and multiple match situations, and the generation of corresponding output signals.

One skilled in the art will recognize that ROM table and the combinational logic may be realized using numerous different circuit designs and architectures. For illustrative purposes, one such design is provided below.

C. Multiple-Match Signaling

Figure 5:
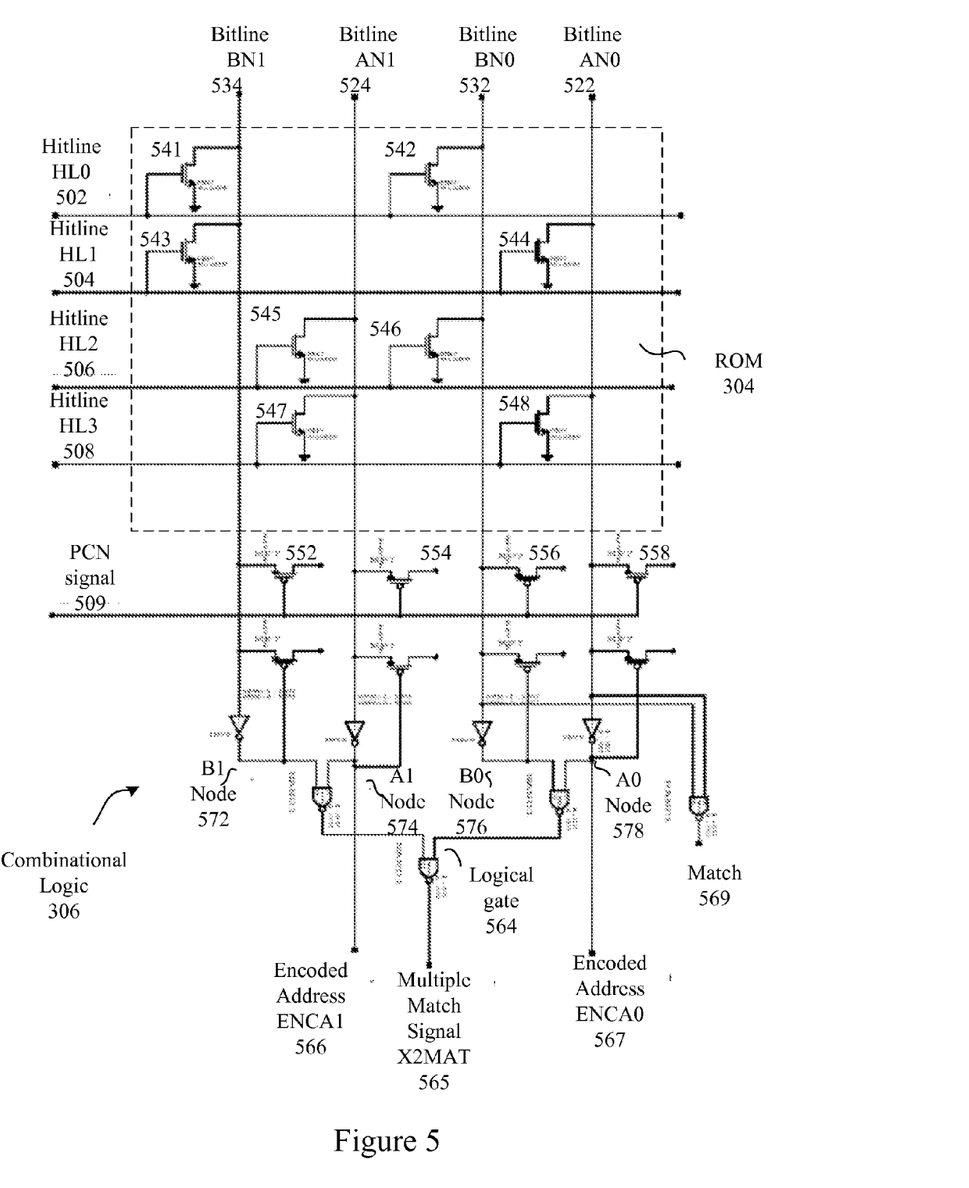
FIG. 5 illustrates a 4-hitline implementation of a multiple match circuit according to certain embodiments of the invention.

FIG. 5 illustrates a circuit-level diagram of a multiple match system according to various embodiments of the invention. This diagram shows a circuit implementation of a 4 hitline, 4 column (2 "A" columns and 2 "B" columns) system. One skilled in the art will recognize that the principles discussed in relation to this particular implementation may be applied to numerous different sizes of ROM matching systems; all of which are intended to fall within the scope of the present invention.

The multiple match system receives four hitlines HL0 502, HL1 504, HL2 506, and HL3 508, which provide signals indicating whether an input word matches one or more stored words in a memory. The column entries may be implemented by bitlines AN0 522, AN1 524, BN0 532 and BN1 534. In one exemplary implementation, the bitlines are pre-charged to a logic state "1" by PMOS transistors 552, 554, 556, 558, which are connected to a PCN signal line 509. During a ROM access operation, the PCN signal line 509 is de-asserted and the pre-charge PMOS transistors are turned off.

Upon activation of any of the hitlines 502, 504, 506, 508, the bitlines AN0 AN0 522, AN1 524, BN0 532, BN1 534 are brought to a logic state "0" if a corresponding connection of a particular bitline contains an NMOS transistor. For example, after activating hitline HL 2 506, the NMOS transistors 545 and 546 cause the corresponding bitlines AN1 524 and BN0 532 to go to a logic state "0." The corresponding signals produced at nodes A1 574 and node B0 576 are a logic state "1." This ROM configuration and circuit structure is used to provide output signals related to input word no-hit conditions, single-hit conditions, and multiple-hit conditions.

a) No-Hit Condition

A no-hit condition occurs when an input word is not found to match a stored word entry within an addressable memory. This no-hit condition results in none of the hitlines HL0 502, HL1 504, HL2 506, and HL3 508 being activated. Consequently, the logic level at nodes A0 578, B0 576, A1 574 and B1 572 are at "0" levels. A vector value is generated indicative of these states such that nodes A0 578 and A1 574, which corresponds to "A entries" columns, have a value of "00." A second vector value is generated at nodes B0 576 and B1 572 having a value of "00."

Combination logic 360 is provided that processes the "A" vector (corresponding to column A entries) and the "B" vector (corresponding to column B entries) to generate an output signal. In one implementation, "A" vector and "B" vector are provided to an AND logic gate which provides a single output. Further, the resulting output from the combination of these vectors may be bitwise OR operated in a logical gate 564 to obtain a multiple match signal X2MAT 565. In the no-hit condition, the multiple match signal X2MAT 565 would have a logic state of "0." This "0" state on the multiple match signal X2MAT 565 indicates to the system that a no-multiple match scenario has occurred. In addition, a "0" state on a match output 569 is generated to indicate the no-hit scenario.

b) Single-Match Condition

A single-hit condition occurs when an input word is found to match only one stored word entry within an addressable memory. In this scenario, a single hitline corresponding to the particular word entry is activated. As a result of the activation of a single hitline, a corresponding "A" vector will have an opposite value than its complimentary "B" vector. For example, the "A" vector generated by signals at nodes A1-A0 574, 578 would have a value of "00" while the complimentary "B" vector at node B1-B0 572, 576 would have a value of "11."

A subsequent AND operation on the "B" vector and the "A" generates a value of "00." A bitwise OR operation on the resultant vector "00" is performed by the logic gate 564 resulting in a multiple match signal X2MAT 565 having a value "0". Once again, this "0" state on the multiple match signal X2MAT 565 indicates to the system that a no-multiple match condition has occurred. A person skilled in the art will recognize that the OR function, as well as other logical functions, may also be implemented using a wide dynamic gate.

The combinational logic 306 is used to produce a match signal 569 indicating a match between an input word and a pre-stored word entry within the addressable memory. This match signal 569 may be implemented by using an OR function between the signal at the node A0 578 and B0 576. An analysis of the match signal 569 and the multiple match signal X2MAT 565 allows a system to identify when a match occurs, and whether that match is a single match event or multiple match event.

An address of the pre-stored word entry, which matches the input word, may also be produced. Signals "ENCA1" 566 and "ENCA0" 567 may be used to produce the address of the matching word entry. For example, if only hitline HL1 504 is activated, then the corresponding value at ENCA1 566 and ENCA0 567 would represent the address of the matching pre-stored word entry.

c) Multiple-Match Condition

A multiple-hit condition occurs when an input word is found to match multiple stored word entries within an addressable memory. In such a scenario, at least two hitlines are asserted as being active corresponding to multiple hits of the input word. As a result, entries in the "A" vector are at different logic levels (in this case either "01" or "10") depending on which hitlines are activated. Entries in the complementary "B" vector are also at different logic levels depending on which hitlines are activated. For example, if hitline HL1 504 and HL3 508 are active, the entries corresponding to bitline AN1 524 of the "A" vector are different from HL1 504 and HL3 508. Similarly, the entries corresponding to bitline BN1 534 of "vector-B" are different from HL1 504 and HL3 508.

The AND operation on the bits at nodes A0 578 and B0 576, A1 574 and B1 572 will result in at least one logic "1" state (either a "01" or "10" depending on which hitlines are activated) within the two bit word. The subsequent bitwise OR operation on the two bit word generates the multiple match signal X2MAT 565, which will result in a logic "1" state. This output will signal the system that a multiple match event has occurred on one of the input words.

D. Hierarchical Connection of ROM Sub-Blocks

Figure 6:
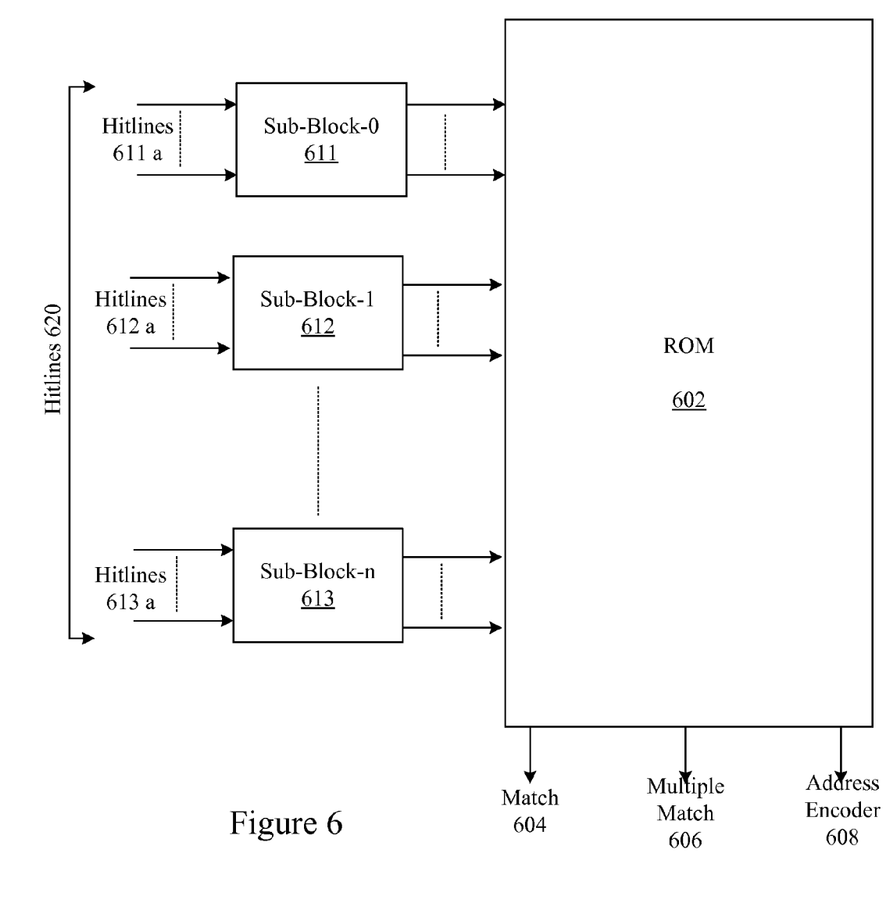
FIG. 6 shows a hierarchically connected multiple match circuit according to various embodiments of the invention.

FIG. 6 illustrates a ROM-based multiple match circuit in which hitline sub-blocks are used prior to the inputs into the ROM according to various embodiments of the invention. These sub-blocks may be of various sizes and are used to reduce the number of hitlines that are provided to a ROM. In one example, the sub-blocks 611, 612, 613 are a 4 row by 4 column implementations used to implement a 16 row by 8 column multiple-match circuit. These sub-blocks (0 to N) 611-613 connect to the ROM 602, which contains a table that corresponds to multiple entries in an addressable memory.

According to various embodiments of the invention, each sub-block 611, 612, 613 receives four inputs from a plurality of hitlines 620. These sub-blocks identify a match scenario based on these four hitlines. The sub-blocks 611, 612, 613 generate five outputs including a match output, and two "A" outputs and two "B" outputs, as well as a match output. The structure of each of these sub-blocks may be equivalent 4×4 ROM shown in FIG. 5. These outputs are provided to a top-level ROM 602 that processes these signals from the sub-blocks 611, 612, 613 and generates a match output 604, a multiple match output 606 and an address decoder output 608.

In one embodiments of the invention, the sub-block match outputs are connected as hitlines to the top-level ROM 602. The top-level ROM generates the match output 604 by processing each of the sub-block match outputs. The sub-block address bits are produced by connecting a sub-block "A0" output to a first column in the top-level ROM 602 and a sub-block "A1" output to a second column in the top-level ROM 602. The top-level address(es) is generated by processing each of these "A" inputs in the top-level ROM 602. The top-level ROM and any corresponding logic generates the multiple match output 606 by having the "A0" and "B0" sub-block outputs being AND'ed together via two series NMOS transistors and wire OR'ed via a ROM-type column with "A1" and "B1" from the same sub-block being AND'ed. Combinational logic is provided that processes each of these combined "A" and "B" signals into a single multiple match output 606.

Figure 7:
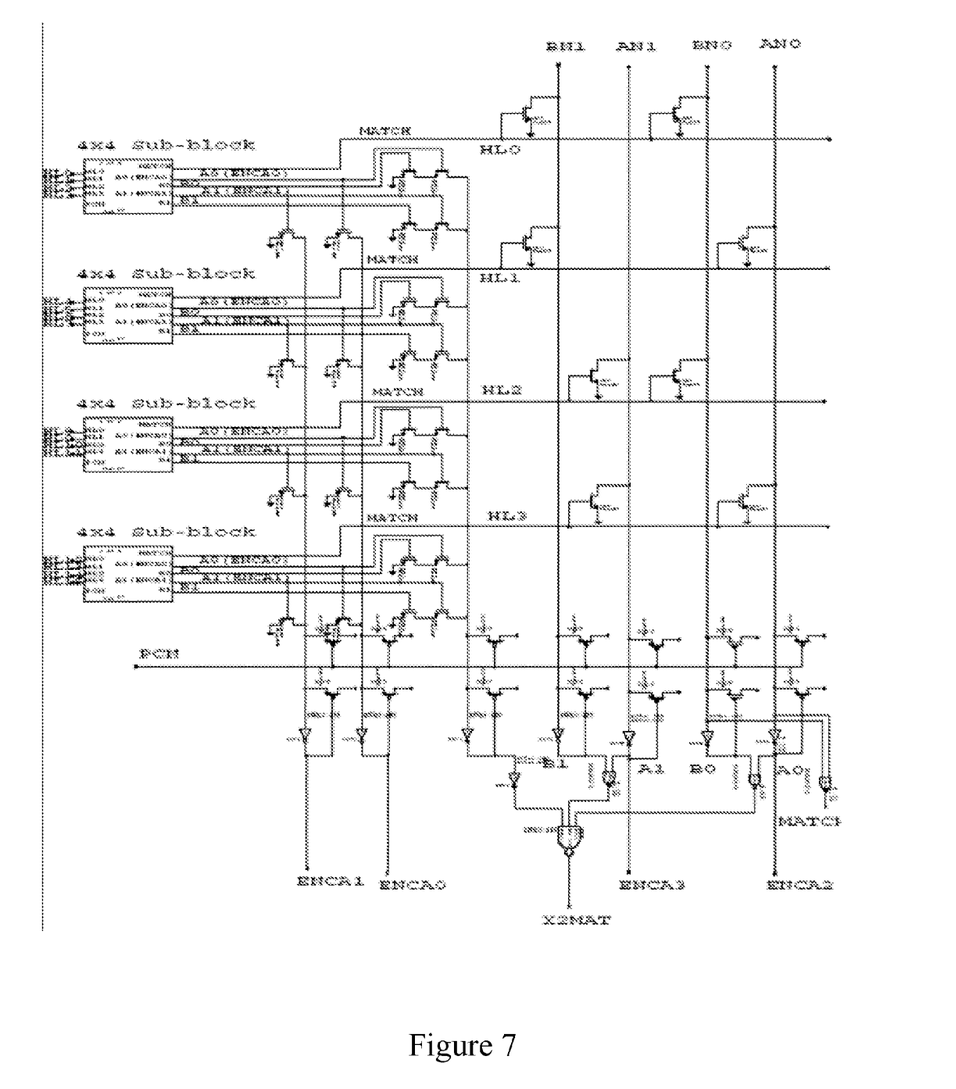
FIG. 7 shows a circuit implementation of a hierarchically connected multiple match circuit according to various embodiments of the invention.

An exemplary circuit implementation of the hierarchical multiple match system is illustrated in FIG. 7. The implementation of sub-blocks allows ROM operations to be separated into parallel processed modules. This separation reduces the complexity of the top-level ROM 602, and provides the system a more easily scalable platform.

While the present invention has been described with reference to certain exemplary embodiments, those skilled in the art will recognize that various modifications may be provided. Accordingly, the scope of the invention is to be limited only by the following claims.

What is claimed is:

1. A ROM-based multiple match system comprising:
 a plurality of input hitlines that communicate digital information related to whether an input word matches at least one stored word within an addressable memory;
 a ROM, coupled to the input hitlines, that processes the digital information using a plurality of column pairs, each column pair having a first column that is complimentary to a second column; and
 a combinational logic, coupled to the ROM, that digitally processes data from the ROM and provides a multiple match output signal identifying an occurrence of a multiple match to the input word.

2. The system of claim 1 wherein the addressable memory is a content addressable memory device.

3. The system of claim 1 wherein the plurality of input hitlines is an array of eight hitlines communicating an eight bit word.

4. The system of claim 1 wherein the first column is an "A" column comprising a series of zeroes and the second column is a "B" column comprising a series of ones.

5. The system of claim 1 wherein the combinational logic comprises a match output and a plurality of address outputs that indicate a physical address of at least one match to the input word.

6. The system of claim 5 wherein the combinational logic comprises a plurality of AND gates, coupled to the plurality of column pairs, that combines each column pair into single signal using an AND operation.

7. The system of claim 6 wherein the combination logic further comprises a multi-input OR gate, coupled to the plurality of AND gates, that generates a multiple match output signal.

8. The system of claim 2 wherein each column within the plurality of column pairs in the ROM comprises a plurality of transistors that generate data vectors associated with the plurality of input hitlines.

9. The system of claim 8 wherein the plurality of transistors comprises a plurality of NMOS transistors.

10. The system of claim 1 wherein the plurality of input hitlines is 64 hitlines and the ROM comprises 6 column pairs.

11. A method for identifying multiple matches to an input word within an addressable memory, the method comprising:
 receiving a digital data stream indicating whether a match occurred between an input word and stored data within an addressable memory;
 creating a first data vector, using a ROM, identifying a first match of the input word;
 creating a second data vector, using the ROM, identifying a second match of the input word, wherein the ROM comprises a plurality of complimentary columns that creates the first and second data vectors; and
 providing a multiple match signal indicating the first and second matches of the input word.

12. The method of claim 11 wherein a combination logic receives the first and second data vectors and generates the multiple match signal.

13. A method for identifying multiple matches to an input word within an addressable memory, the method comprising;
 receiving a digital data stream indicating whether a match occurred between an input word and stored data within an addressable memory;

providing a hierarchical processing of the digital data stream across a primary Rom and a plurality of sub-block ROMs;

creating a first data vector, using a ROM, identifying a first match of the input word;

creating a second data vector, using the ROM, identifying a second match of the input word; and, providing a multiple match signal indicating the first and second matches of the input word.

14. The method of claim 13 wherein the plurality of sub-block ROMs are coupled to receive the digital data stream, process the digital data stream, and provide a plurality of output signals to the primary ROM.

15. A hierarchical ROM-based multiple match system comprising:

a plurality of hitlines that communicate digital information indicating whether an input word matches at least one stored word within an addressable memory;

a plurality of ROM sub-blocks, coupled to the plurality of hitlines, that identify a match to the input word using a sub-set of the plurality of hitlines and that generates a plurality of ROM sub-block outputs indicating the match;

a primary ROM, coupled to the plurality of ROM sub-blocks, that process the plurality of ROM sub-block outputs and that identify a multiple match of the input word within the addressable memory; and a multiple match output signal, coupled to the primary ROM, that indicates the multiple match.

16. The system of claim 15 further comprising a match output signal, coupled to the primary ROM, that indicates a match of the input word in the addressable memory.

17. The system of claim 15 further comprising at least one encoded address signals, coupled to the primary ROM, that provides at least one address within the addressable memory associated with a match of the input word.

18. The system of claim 15 wherein the addressable memory is a content addressable memory device.

* * * * *